US007579838B2

(12) United States Patent
Hollis

(10) Patent No.: US 7,579,838 B2
(45) Date of Patent: Aug. 25, 2009

(54) SYSTEMS, METHODS AND APPARATUS FOR A PARTIALLY ELONGATED FIELD OF VIEW IN A MAGNETIC RESONANCE IMAGING SYSTEM

(75) Inventor: Timothy James Hollis, Bicester (GB)

(73) Assignee: General Electric Company, Schenectady, NY (US)

(*) Notice: Subject to any disclaimer, the term of this patent is extended or adjusted under 35 U.S.C. 154(b) by 38 days.

(21) Appl. No.: 11/283,132

(22) Filed: Nov. 18, 2005

(65) Prior Publication Data

US 2007/0114997 A1  May 24, 2007

(51) Int. Cl.
*G01V 3/00* (2006.01)
(52) U.S. Cl. .......................... 324/320; 324/318; 324/319
(58) Field of Classification Search .................. 324/307, 324/309, 300–322; 335/296, 299; 600/407–435
See application file for complete search history.

(56) References Cited

U.S. PATENT DOCUMENTS

| | | | | |
|---|---|---|---|---|
| 3,469,180 | A * | 9/1969 | Anderson | 324/320 |
| 5,289,128 | A * | 2/1994 | DeMeester et al. | 324/318 |
| 5,414,360 | A * | 5/1995 | Westphal et al. | 324/318 |
| 5,530,354 | A * | 6/1996 | Herlihy et al. | 324/318 |
| 5,646,532 | A * | 7/1997 | Knuttel et al. | 324/321 |
| 5,708,362 | A * | 1/1998 | Frese et al. | 324/319 |
| 5,764,059 | A * | 6/1998 | Mansfield et al. | 324/318 |
| 6,064,208 | A * | 5/2000 | Steckner | 324/320 |
| 6,208,142 | B1 * | 3/2001 | Wagshul | 324/319 |
| 6,275,039 | B1 * | 8/2001 | Young et al. | 324/319 |
| 6,288,624 | B1 * | 9/2001 | Savelainen | 335/299 |
| 6,313,633 | B1 * | 11/2001 | Boskamp | 324/319 |
| 6,853,281 | B1 * | 2/2005 | Kakugawa et al. | 335/296 |
| 6,977,571 | B1 * | 12/2005 | Hollis et al. | 335/216 |
| 7,167,004 | B1 * | 1/2007 | Kruip | 324/320 |
| 2006/0055406 | A1 * | 3/2006 | Lvovsky et al. | 324/318 |
| 2007/0114997 | A1 * | 5/2007 | Hollis | 324/318 |

* cited by examiner

*Primary Examiner*—Brij B. Shrivastav
*Assistant Examiner*—Tiffany A Fetzner
(74) *Attorney, Agent, or Firm*—Peter Vogel, Esq.; Jean Tibbetts, Esq.; Michael G. Smith, Esq.

(57) ABSTRACT

Systems, methods and apparatus are provided through which a partially elongated field-of-view in a magnetic resonance imaging system is generated either by an asymmetric primary coil or a conventional symmetrical primary coil with a supplementary high odd-order shim that elongates the field-of-view towards one end of the bore. For significantly increased efficiency, the high odd-order shim can evoke specific parts of the primary coil by injecting additional current and/or subtracting current from specific turns, as required.

20 Claims, 9 Drawing Sheets

SYSTEMS, METHODS AND APPARATUS FOR A PARTIALLY ELONGATED FIELD OF VIEW IN A MAGNETIC RESONANCE IMAGING SYSTEM

FIELD OF THE INVENTION

This invention relates generally to generating magnetic fields, and more particularly to modifying generated magnetic fields.

BACKGROUND OF THE INVENTION

Magnetic resonance imaging (MRI) is a technique in which an object is placed in a magnetic field and subjected to pulses of the electromagnetic field at a frequency. The pulses cause nuclear magnetic resonance in the object, the spectra obtained thereby being processed numerically to form cross-sectional images of the object. MRI imaging is especially useful for medical or veterinary applications because different living tissues emit different characteristics of resonance signals, thus enabling visualization of the different living tissues in the obtained image. An MRI apparatus thus operates in general by the application of a radio frequency (RF) electromagnetic field in the presence of other magnetic fields, and the subsequent sensing and analysis of the resulting nuclear magnetic resonances induced in the body.

Conventional MRI systems include a main magnet which generates a strong static magnetic field of a high temporal stability and a high spatial homogeneity within a field-of-view (FOV) where the imaging takes place. Conventional MRI systems also include a gradient coil assembly located in the bore between the main magnet and the RF coil and generating space-varying fields. The gradient coil assembly causes the response frequency and phase of the nuclei of the patient body to depend upon position within the FOV thus providing a spatial encoding of the body-emitted signal. Conventional MRI systems further include RF coil/coils arranged within the bore which emit RF waves and receive resonance signal from the body. The superconducting main magnet is typically used to achieve high field strength; superconducting main magnet comprises a plurality of concentric coils placed inside a cryostat which is designed to provide a low temperature operating environment for superconducting coils.

The confined space in the bore of MRI scanners often causes patient discomfort and a feeling of claustrophobia. In an attempt to reduce the discomfort of the patients and claustrophobic feelings, magnet designers typically try to minimize or shorten the length of the magnet. Unfortunately, reducing the length of the magnet also reduces the length of the uniform field region and compromises the imaging functionality. Short magnets typically have symmetrical, ellipsoidal FOVs, compared to spherical FOVs on longer magnets.

FOV requirements 900 for various image types are illustrated FIG. 9 where it can be seen that many scans require a FOV length of 40 centimeters (cm). Whole spine and peripheral vascular studies require an even longer uniform field region of approximately 45 cm-50 cm length.

As shown in FIG. 9, MRI systems with shortened FOVs do not accommodate imaging of anatomy that requires a large FOV, such as imaging of a whole spine or imaging of peripheral vascular studies.

Conventional solutions to overcome the effects of the shortened FOV include the use of a multiple scan system, where the patient is physically moved along the bore between scans. However the multiple scan system suffers from increased scan duration and mechanical complexity which is expensive to manufacture and maintain.

For the reasons stated above, and for other reasons stated below which will become apparent to those skilled in the art upon reading and understanding the present specification, there is a need in the art for a magnetic resonance imaging system that is more comfortable for patients, is less likely to invoke a sense of claustrophobia in patients, does not reduce the length of the uniform field region, and does not compromise the imaging functionality without adding mechanical complexity.

BRIEF DESCRIPTION OF THE INVENTION

The above-mentioned shortcomings, disadvantages and problems are addressed herein, which will be understood by reading and studying the following specification.

In one aspect, a high odd-order shim elongates the field-of-view in one direction.

In another aspect, injecting current and/or subtracting current from specific magnet coils to change the shape of the field-of-view.

In yet another aspect, an actively shielded field-of-view extension coil or circuitry elongates the field-of-view.

In still another aspect, a sweeping field-of-view extends from one end to the other.

Apparatus, systems, and methods of varying scope are described herein. In addition to the aspects and advantages described in this summary, further aspects and advantages will become apparent by reference to the drawings and by reading the detailed description that follows.

DETAILED DESCRIPTION OF THE INVENTION

In the following detailed description, reference is made to the accompanying drawings that form a part hereof, and in which is shown by way of illustration specific embodiments which may be practiced. These embodiments are described in sufficient detail to enable those skilled in the art to practice the embodiments, and it is to be understood that other embodiments may be utilized and that logical, mechanical, electrical and other changes may be made without departing from the scope of the embodiments. The following detailed description is, therefore, not to be taken in a limiting sense.

The detailed description is divided into four sections. In the first section, a system level overview is described. In the second section, apparatus of embodiments are described. In the third section, embodiments of methods are described. Finally, in the fourth section, a conclusion of the detailed description is provided.

System Level Overview

Figure 1:
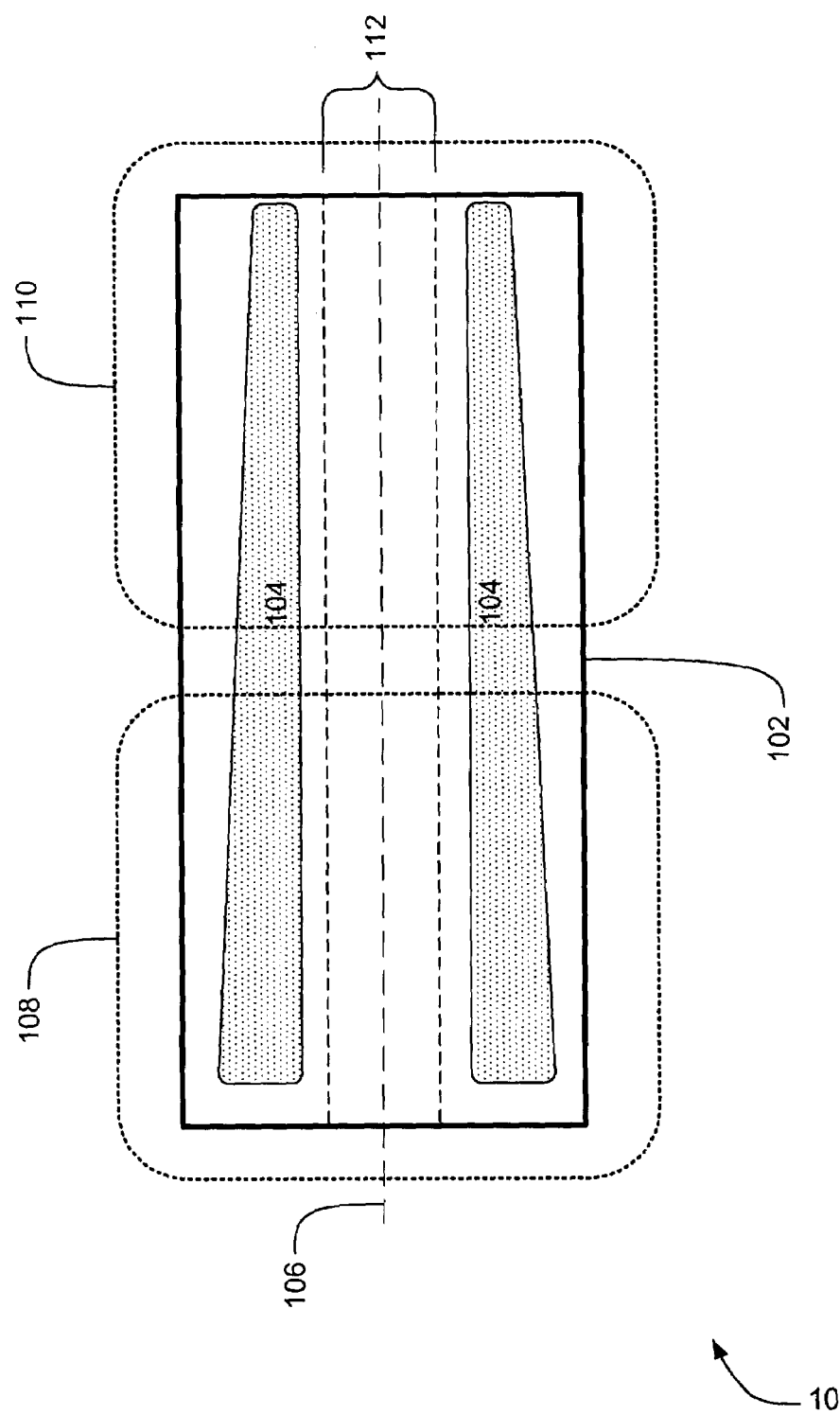
FIG. 1 is cross section block diagram of an overview of a system to generate a magnetic resonance imaging field-of-view.

FIG. 1 is cross section block diagram of an overview of a system to generate a magnetic resonance imaging field-of-view. System 100 solves the need in the art for a magnetic resonance imaging system that is more comfortable for patients, is less likely to invoke a sense of claustrophobia in patients, does not reduce the length of the uniform field region, and does not compromise the imaging functionality without adding mechanical complexity.

System 100 includes a cryogenic container 102 and a magnet coil 104 having an asymmetric geometry along a longitudinal axis 106. The magnet coil is asymmetric because the coils on one end are not an exact mirror image of the coils on the other end. Either end 108 or 110 can be what is conventionally referred to as a patient end or as a service end. The asymmetric geometry of the magnet coil 104 that is shown in FIG. 1 is one example of an asymmetric geometry. Other asymmetric geometries are within the scope of the asymmetric geometry of system 100.

The magnet coil 104 is mounted in the cryogenic container 102. The cryogenic container 102 also includes a bore 112. A patient is moved into the bore during imaging.

Figure 3:
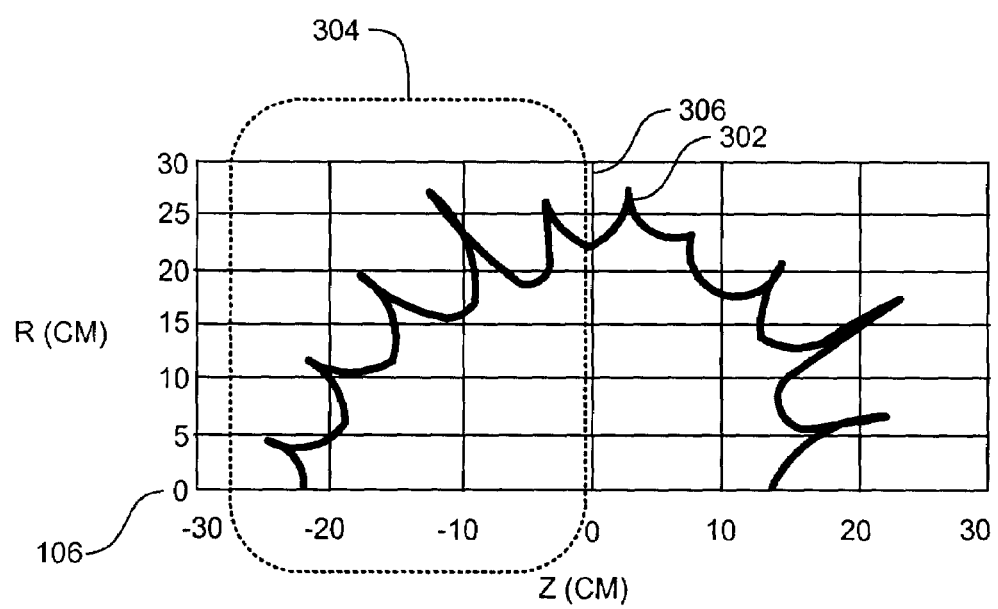
FIG. 3 is a contour plot of an asymmetrical magnetic field-of-view according to an embodiment.

When the geometrically asymmetrical magnet coil 104 is energized, the geometrically asymmetrical magnet coil 104 generates a magnetic field with a homogenous field region of field-of-view (FOV) that is slightly elongated on one end, as shown in FIG. 3 below. The elongated FOV increases the size of the FOV. Thus, the geometrically asymmetrical magnet coil 104 solves the need in the art to reduce the length of the magnet without reducing the length of the uniform field region. On the contrary the geometrically asymmetrical magnet coil 104 increases the size of the FOV, including the length of the uniform field region. In addition, the geometrically asymmetrical magnet coil 104 is not significantly mechanically complex, and does not compromise the imaging functionality. The geometrically asymmetrical magnet coil 104 also does not require an additional high odd-order shim.

In some embodiments, the magnetic (FOV) is elongated towards, or in a direction from, which the patient enters the bore. In those embodiments, the magnetic FOV extends towards the patient, reducing the extent to which the patient needs to move into the bore to be within the magnetic FOV. Reducing the extent to which the patient needs to move into the bore is particularly helpful to claustrophobic patients because more of the patient's body can remain outside of the interior of the system, and less of their body inside the system. Thus a claustrophobic person is likely to feel threatened or panicked by the experience of being imaged in system 100. Thus, system 100 solves the need to reduce a sense of claustrophobia in patients.

The reduced need to move the patient into the bore is also more comfortable for many patients. Many patients have physical or mechanical difficulty placing the portion of their body to be imaged in the bore. Often, these difficulties are the result of an injury, such as the injury that is the reason for the imaging. Or these difficulties are the result of the need to image an extremity, such as a leg, in which the other extremity would extend into a face of the cryogenic container 102 and thus the leg that is not imaged must be bent at the knee or placed out to the side of the cryogenic container, either of which can be uncomfortable for even a short period of time, and even more so for an extended amount of time during imaging. However, in many situations such as head imaging, the elongated FOV reduces the extent to which the patient's body must be move into the bore 112, and reduces the need to contort the patient's body. In the example of imaging a head, the elongated FOV reduced the extent to which the body is place in the bore, which reduces the possibility or extent of a claustrophobic reaction in a claustrophobic patient. Thus system 100 improves the comfort of a patient, whether or not the patient is claustrophobic.

System 100 solves the need in the art for a magnetic resonance imaging system that is more comfortable for patients, does not egregiously invoke a sense of claustrophobia in patients, does not reduce the length of the uniform field region, and does not compromise the imaging functionality without adding mechanical complexity.

While the system 100 is not limited to any particular cryogenic container 102, geometrically asymmetrical magnet coil 104, longitudinal axis 106, ends 108 and 110 and bore 112, for sake of clarity a simplified cryogenic container 102, geometrically asymmetrical magnet coil 104, longitudinal axis 106, ends 108 and 110 and bore 112 are described.

In some embodiments, the magnetic (FOV) is elongated away from the direction in, which the patient enters the bore, which is helpful in imaging of shoulders or elbows because the wider portion of the FOV is closest to the patient end.

APPARATUS EMBODIMENTS

In the previous section, a system level overview of the operation of an embodiment was described. In this section, the particular apparatus of such an embodiment are described by reference to a series of diagrams.

Figure 2:
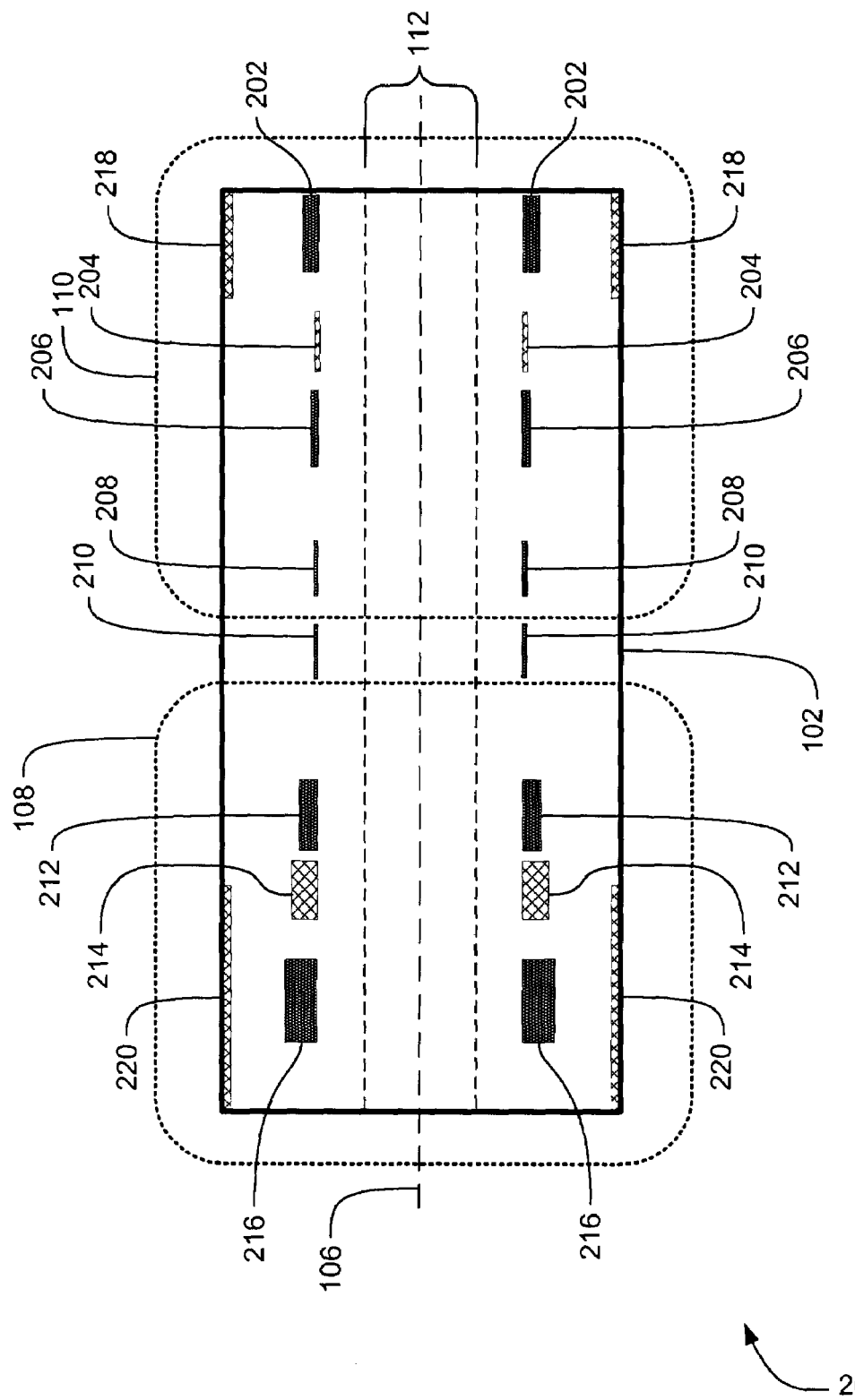
FIG. 2 is a cross section block diagram of apparatus according to an embodiment of a geometrically asymmetrical primary magnet coil.

FIG. 2 is a cross section block diagram of apparatus 200 according to an embodiment of a geometrically asymmetrical primary magnet coil. Apparatus 200 shows one embodiment of the geometrically asymmetrical magnet coil 104 in FIG. 2. Apparatus 200 solves the need in the art for a magnetic resonance imaging system that is more comfortable for patients, is less likely to invoke a sense of claustrophobia in patients, does not reduce the length of the uniform field region, and does not compromise the imaging functionality without adding mechanical complexity.

In apparatus 200 includes a geometrically asymmetrical primary magnet coil that includes coils 202, 204, 206, 208, 210, 212, 214, 216, 218 and 220. The magnet coil is asymmetric because the coils on one end are not an exact mirror image of the coils on the other end When the magnet coils 202, 204, 206, 208, 210, 212, 214, 216, 218 and 220 are energized, they, generate a uniform magnetic field or magnetic field-of-view (FOV) that is slightly elongated, as shown in FIG. 3 below. The elongated FOV increases the size of the FOV. Thus, the magnet coils 202, 204, 206, 208, 210, 212, 214, 216, 218 and 220 solve the need in the art to reduce the length of the magnet without reducing the length of the uniform field region. On the contrary the magnet coils 202, 204, 206, 208, 210, 212, 214, 216, 218 and 220 increase the size of the FOV. In addition, the magnet coils 202, 204, 206, 208, 210, 212, 214, 216, 218 and 220 are not significantly mechanically complex, and do not compromise the imaging functionality. In addition, the elongated magnetic FOV is more comfortable to patients, especially during imaging of extremities that is less likely to invoke claustrophobia in patients in apparatus 200.

Apparatus 200 also includes optional active shield coils 218 and 220.

FIG. 3 is a contour plot of an asymmetrical magnetic field-of-view 300 according to an embodiment. FOV 300 solves the need in the art for comfort of patients, with less claustrophobia, that does not require an increased length of the magnet bore, compromised imaging functionality or increased mechanical complexity.

A ±5 parts per million (ppm) contour line 302 of the asymmetrical magnetic FOV is elongated towards one end of the patient bore. The contour line 302 depicts where the field strength differs by 5 ppm from the field strength at the intersection between axes 306 and 106. Everywhere within this contour, the field strength is within ±5 ppm of the field strength at the intersection. Although there is a slight reduction in the extent of FOV at the other end compared to a conventional symmetrical geometry, the overall length of the FOV is increased by about 20%. More specifically, in the illustrated example, the ±5 ppm contour line 302 extends more than 20 centimeters (cm) past the center line 306 at the longitudinal axis 106 on one end, while the ±5 ppm line 302 extends less than 20 cm past the center line 306 at the longitudinal axis 106 on the other end. In some embodiments, the contour plot of the 5 Gauss line appears to be shaped somewhat like a one-half of a pear. The elongated magnetic FOV increases the size of the FOV which solves the need in the art to increase patient comfort, reduce claustrophobia while not reducing the length of the FOV, not increasing mechanically complexity significantly, and not compromising the imaging functionality.

The magnetic field, more precisely: the z component of the magnetic flux density, $B_z$, can be approximated inside the imaging volume by a truncated spherical harmonic series. These are usually expressed as a sum of Legendre polynomials and associated Legendre polynomials in a co-ordinate system at which the origin is at the magnet center. The expansion expressed in spherical co-ordinates is shown in Table 2 below:

TABLE 2

$$H(r, \theta, \phi) = \sum_{n=0}^{\infty} \sum_{m=0}^{m=n} r^n P_n^m (\cos\theta) [A_n^m \cos(m\phi) + B_n^m \sin(m\phi)]$$

In table 2, the functions $P_n^m (\cos \theta)$ are known as Associated Legendre polynomials. $A_n^m$ and $B_n^m$ are spherical harmonic coefficients which define the field variation.

In some embodiments, the relationship of odd-order axial spherical harmonic coefficients and even order axial spherical harmonic coefficients to field strength are described in Table 3 below:

TABLE 3

| (n · m) Odd | ppm @ 22.5 cm | (n · m) Even | ppm @22.5 cm |
| --- | --- | --- | --- |
| (1.0) | 0 | (2.0) | 0 |
| (3.0) | 0 | (4.0) | 0 |
| (5.0) | 0 | (6.0) | 0 |
| (7.0) | −47 | (8.0) | −47 |
| (9.0) | −44 | (10.0) | −42 |
| (11.0) | +17 | (12.0) | +17.6 |

In Table 3, the high odd-order terms cancel the high even order terms and elongate the FOV on one end of the bore. Conversely, on the other end of the bore, there is a reduction in the extent of FOV but this is much less extensive. For the z component of the magnetic flux density along the Z axis (axis passing longitudinally through the bore of the magnet), the axial terms can be expressed in cartesian representation as follows:

(7,0)=Z raised to the power 7(or $Z^7$)

(9,0)=Z raised to the power 9(or $Z^9$)

(11,0)=Z raised to the power 11(or $Z^{11}$)

For example, −47 ppm of (7,0), normalised at 22.5 cm radius, has an influence on the field along the Z axis at position Z (in cm) as follows:

$$B_z(7,0) = -47 * B_{mag}/1000000 * (Z/22.5)^7$$

Where $B_{mag}$ is the background field produced by the magnet in Tesla units.

By selecting the sign of the odd-order terms, a selection is made as to whether to elongate the FOV on one end of the magnet bore, such as the patient end, or the service end of the magnet bore. In an alternative embodiment, the relationship of odd-order axial spherical harmonic coefficients and even order axial spherical harmonic coefficients to field strength are described in Table 3 below:

TABLE 4

| (n · m) Odd | ppm @ 22.5 cm | (n · m) Even | ppm @22.5 cm |
| --- | --- | --- | --- |
| (1.0) | 0 | (2.0) | 0 |
| (3.0) | 0 | (4.0) | 0 |
| (5.0) | 0 | (6.0) | 0 |
| (7.0) | +47 | (8.0) | −47 |
| (9.0) | +44 | (10.0) | −42 |
| (11.0) | −17 | (12.0) | +17.6 |

In Table 4, the high odd-order terms cancel high even order terms to elongate the FOV on the other side of the bore. In table 4, the signs of the odd-order axial spherical harmonic coefficients [(7,0), (9,0), (11,0)] are reversed in comparison to table 3.

Table 3 and Table 4, above illustrate that by introducing a slight asymmetry to the design with negative high odd-order terms, the size of the homogenous region on one end of the bore is increased. The result is a pear shaped field of view with approximately 20% increase in overall length.

Figure 4:
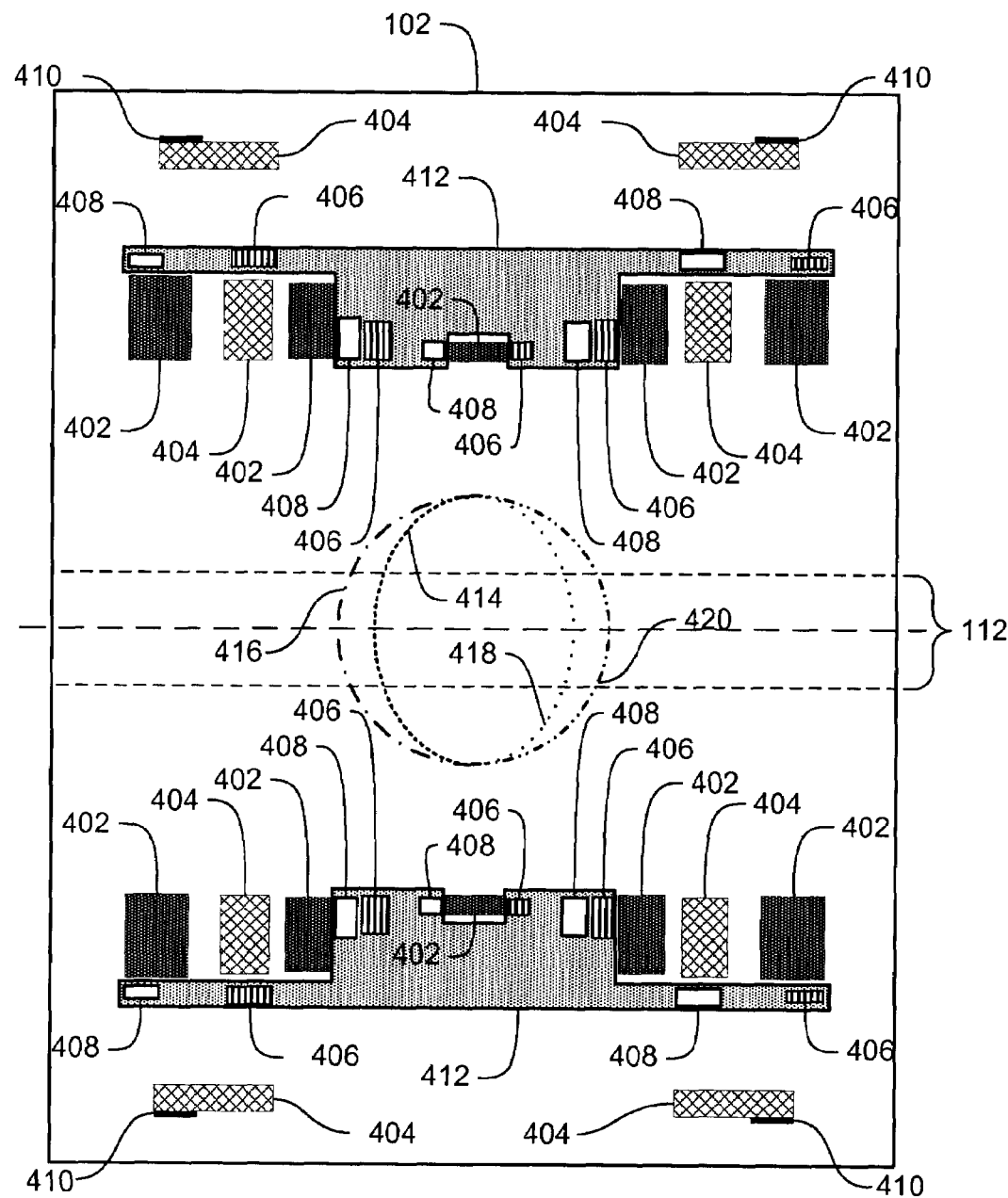
FIG. 4 is a cross section block diagram of apparatus according to an embodiment having a short magnet with an isolated high odd-order shim.

FIG. 4 is a cross section block diagram of apparatus 400 according to an embodiment having a short magnet with an isolated high odd-order shim. The high odd order-shim elongates the field-of-view in one direction. Apparatus 400 solves the need in the art for a magnetic resonance imaging system that is more comfortable for patients, is less likely to invoke a sense of claustrophobia in patients, does not reduce the length of the uniform field region, and does not compromise the imaging functionality without adding mechanical complexity.

Apparatus 400 includes a primary magnet coil having positive (+ve) turns 402, negative (−ve) turns 404. Apparatus 400 also includes an elongation coil having positive (+ve) turns 406, negative (−ve) turns 408 and active shield turns 410. Apparatus 400 also includes a cryogenic container 102.

Negative current (−ve) in the high order shim (406, 408 and 410) causes the ±5 ppm contour line 414 of the FOV to extend in the direction towards line 416. Positive current (+ve) in the high order shim causes the ±5 ppm contour line 418 of the FOV to extend in the direction towards line 420.

Figure 5:
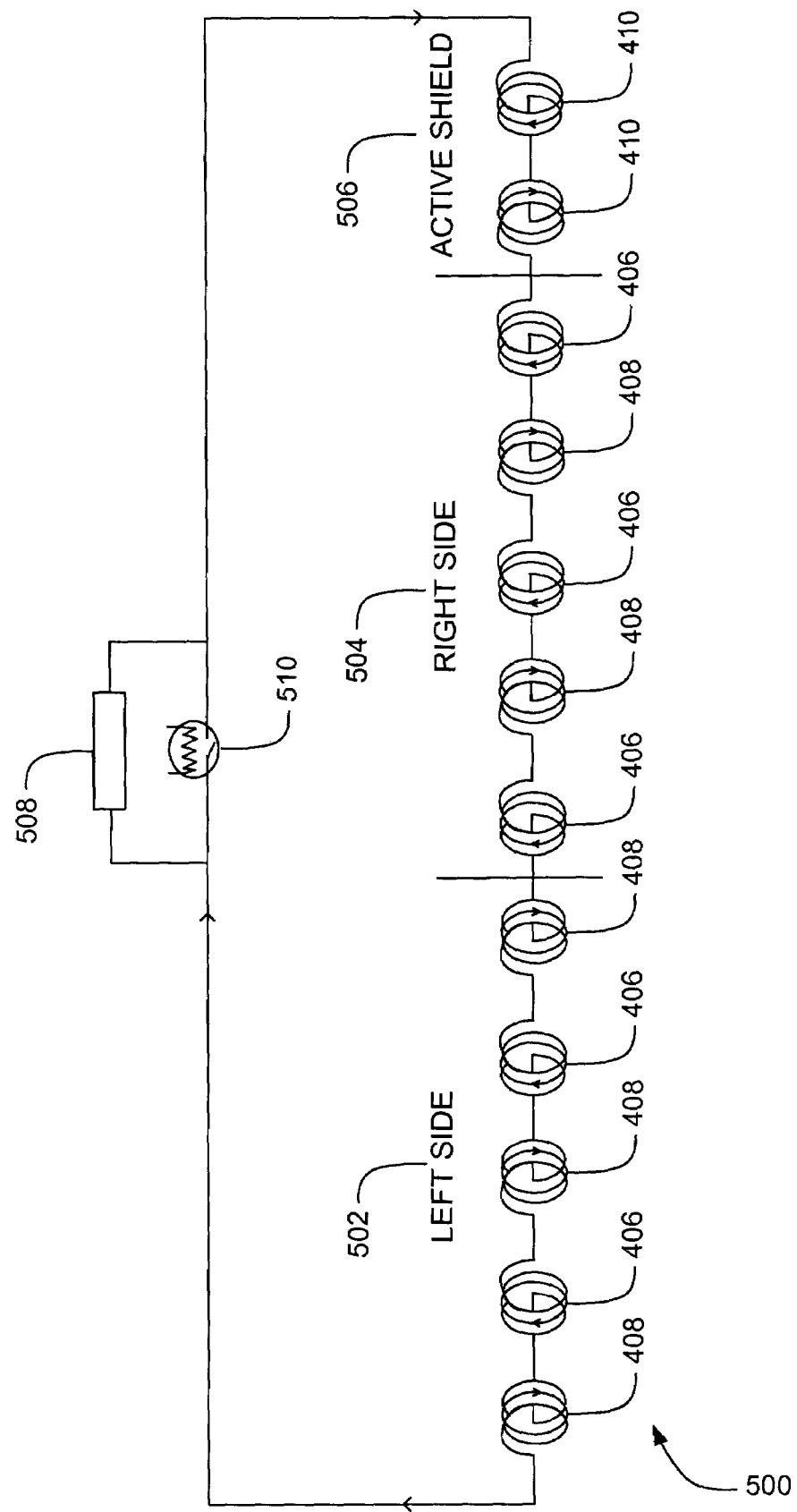
FIG. 5 is a circuit diagram of an isolated high odd-order shim coil with a persistent switch.

FIG. 5 is a circuit diagram of an isolated high odd-order shim coil 500 with a persistent switch. The isolated high odd-order shim coil 500 can be implemented in a magnetic resonance imaging (MRI) system such as apparatus 400. By switching the polarity of the current in the high order shim, one can elongate the FOV to the desired end of the bore.

The isolated high odd-order shim coil 500 includes a series of superconducting coils (406, 408 and 410) arranged to the left side 502 of an MRI system, a right side 504 and an active shield 506. The isolated high odd-order shim coil 500 also includes a superconducting switch 510 and protection resistor 508. In some embodiments, the resistor 508 is replaced by switch protection diodes, which overcome time constant effects when setting the shim.

Figure 6:
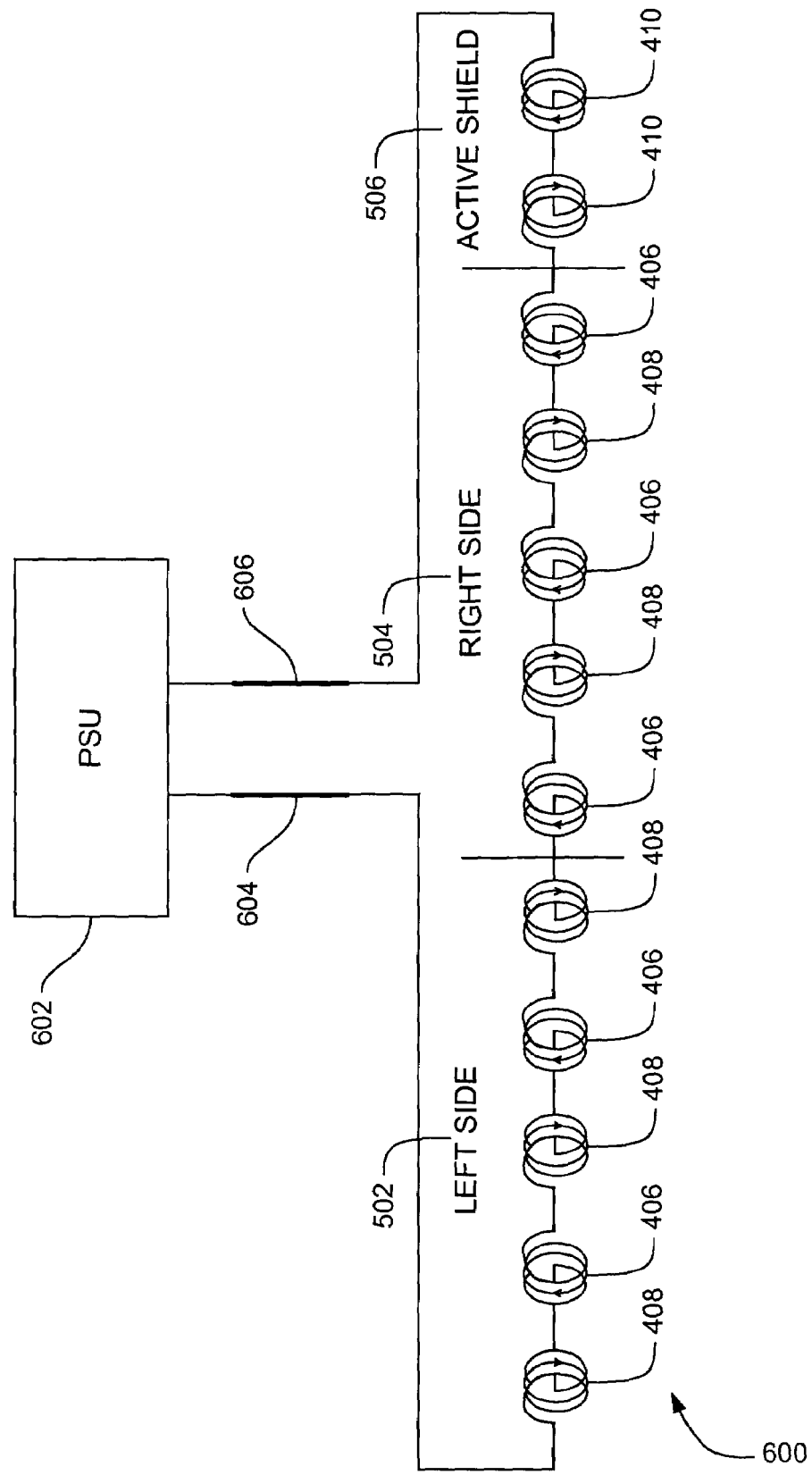
FIG. 6 is a circuit diagram of an isolated high odd-order shim coil with an external power supply.

FIG. 6 is a circuit diagram of an isolated high odd-order shim coil 600 with an external power supply. The isolated high odd-order shim coil 600 can be implemented in a magnetic resonance imaging (MRI) system such as apparatus 400.

The isolated high odd-order shim coil 600 includes a series of superconducting coils (406, 408 and 410) arranged to the left side 502 of an MRI system, a right side 504 and an active shield 506. The isolated high odd-order shim coil 600 also includes a power supply unit (PSU) 602 and high temperature superconducting (HTS) wires that bring wires of the isolated high odd-order shim coil 600 outside a cryogenic container (not shown) through a turret (not shown). Since the inductance of the high order shim is low, of the order of a few Henries, it would be feasible to ramp the high order shim to the desired current very quickly, without seeing excessive voltage at the PSU terminals. This could allow the FOV extension to sweep from one end of the bore to the other, enabling whole spine imaging on a short magnet, without the need to move the patient in the bore.

Figure 7:
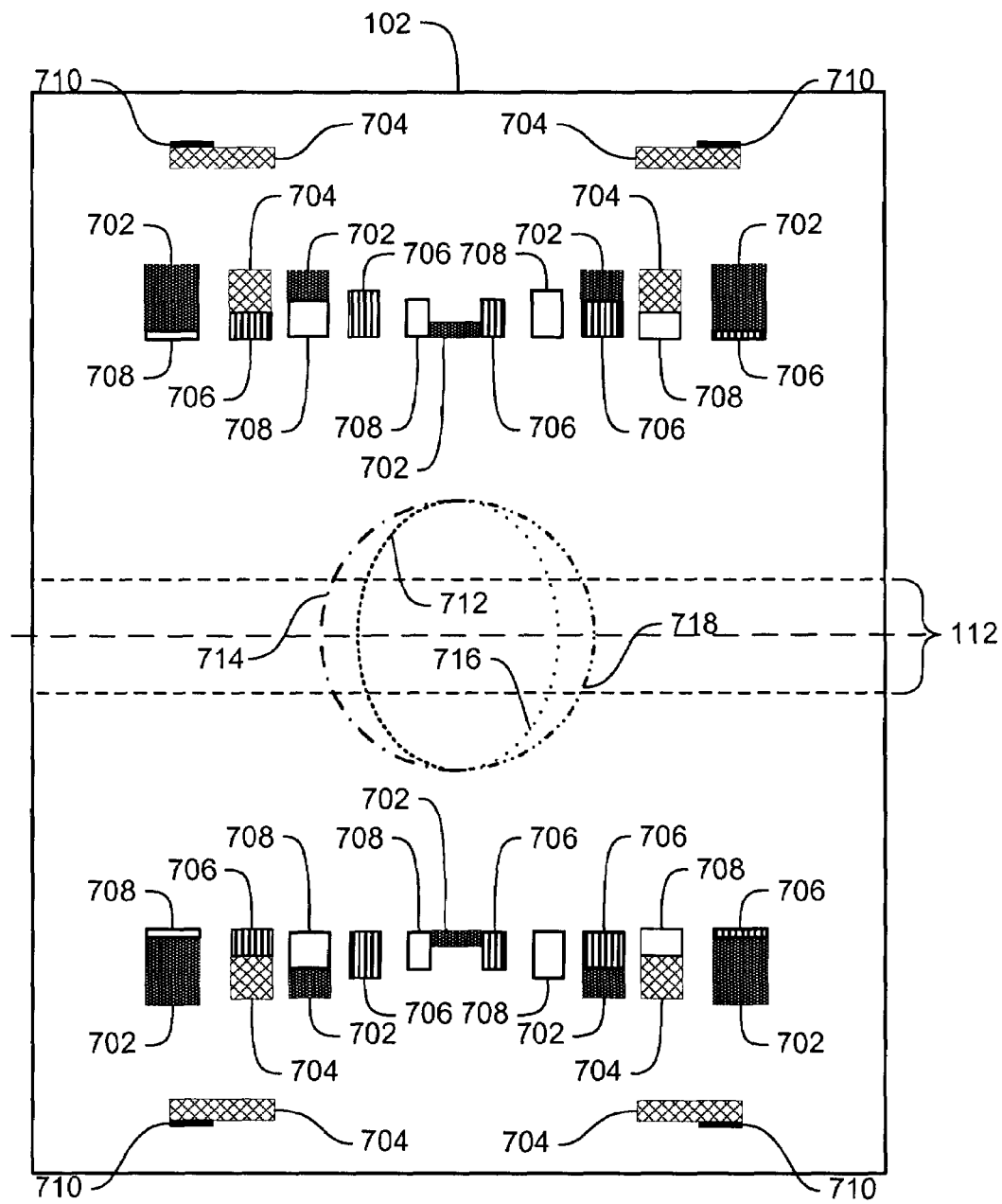
FIG. 7 is a cross section block diagram of apparatus according to an embodiment having a short magnet with supplementary field-of-view extension circuit.

FIG. 7 is a cross section block diagram of apparatus 700 according to an embodiment having a short magnet with supplementary field-of-view extension circuit. Apparatus 700 solves the need in the art for a magnetic resonance imaging system that is more comfortable for patients, is less likely to invoke a sense of claustrophobia in patients, does not reduce the length of the uniform field region, and does not compromise the imaging functionality without adding mechanical complexity.

Apparatus 700 includes a primary magnet coil having positive (+ve) turns 702, negative (−ve) turns 704. Apparatus 700 also includes an elongation coil having positive (+ve) turns 706, negative (−ve) turns 708 and active shield turns 710. It should be noted that some coils are being utilized by both the primary coil and the high order shim. For example, where a high order shim coil 708 is superimposed above a primary coil 702, as can be seen on the left had side of FIG. 7, the intersecting region represents turns that belong to both the primary coil and the high order shim coil. In apparatus 700, the high order shim makes use of the primary coils. In some instances of apparatus 700, additional current is injected into specific primary coils and in other instances, current is removed from specific primary coils.

Negative current (−ve) in the coils causes the ±5 ppm contour line 712 of the FOV to extend in the direction towards line 714. Positive current (+ve) in the coils causes the ±5 ppm contour line 716 of the FOV to extend in the direction towards line 718.

Figure 8:
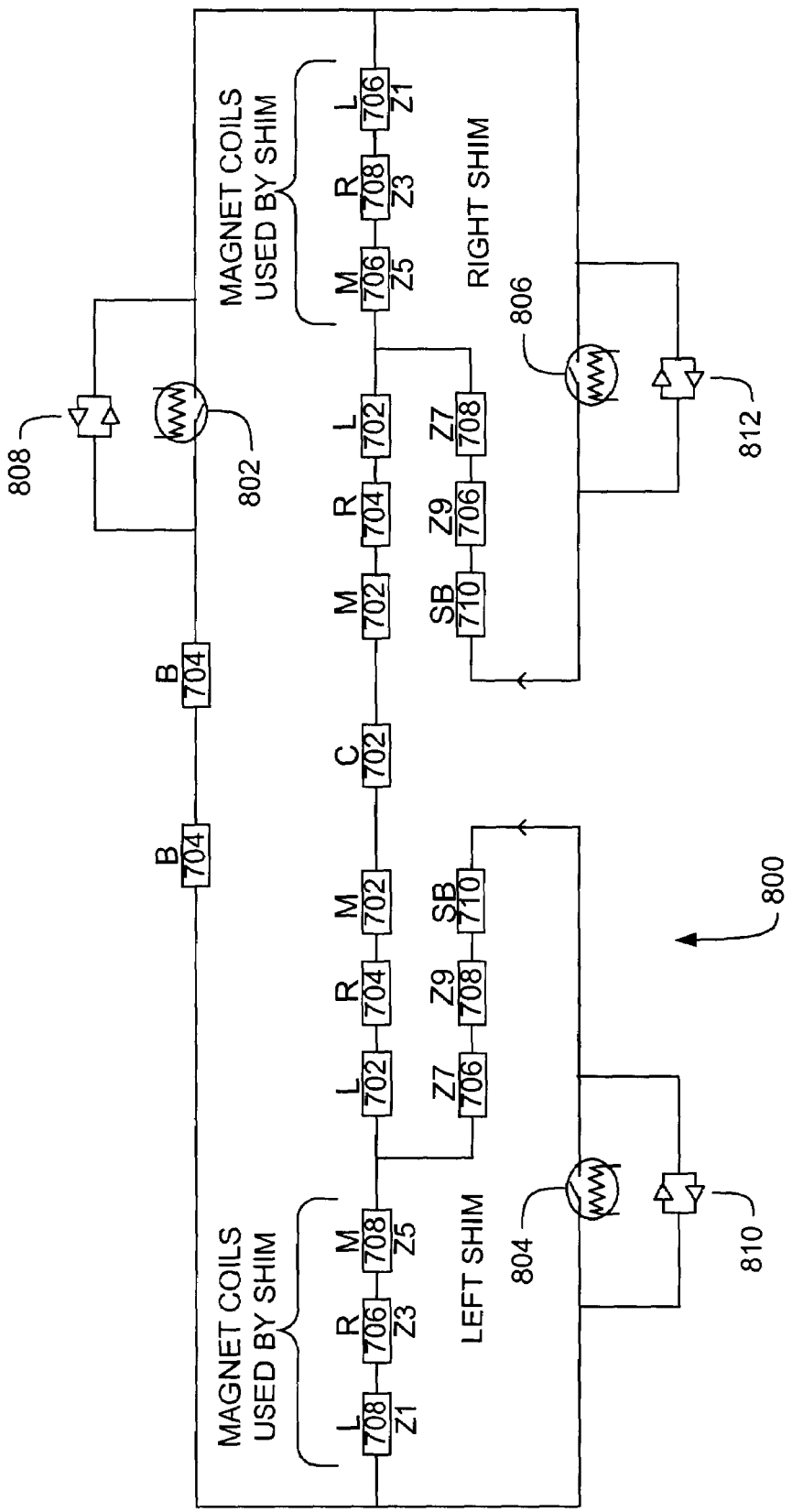
FIG. 8 is a circuit diagram according to an embodiment having a short magnet with field-of-view extension circuit.
Figure 9:
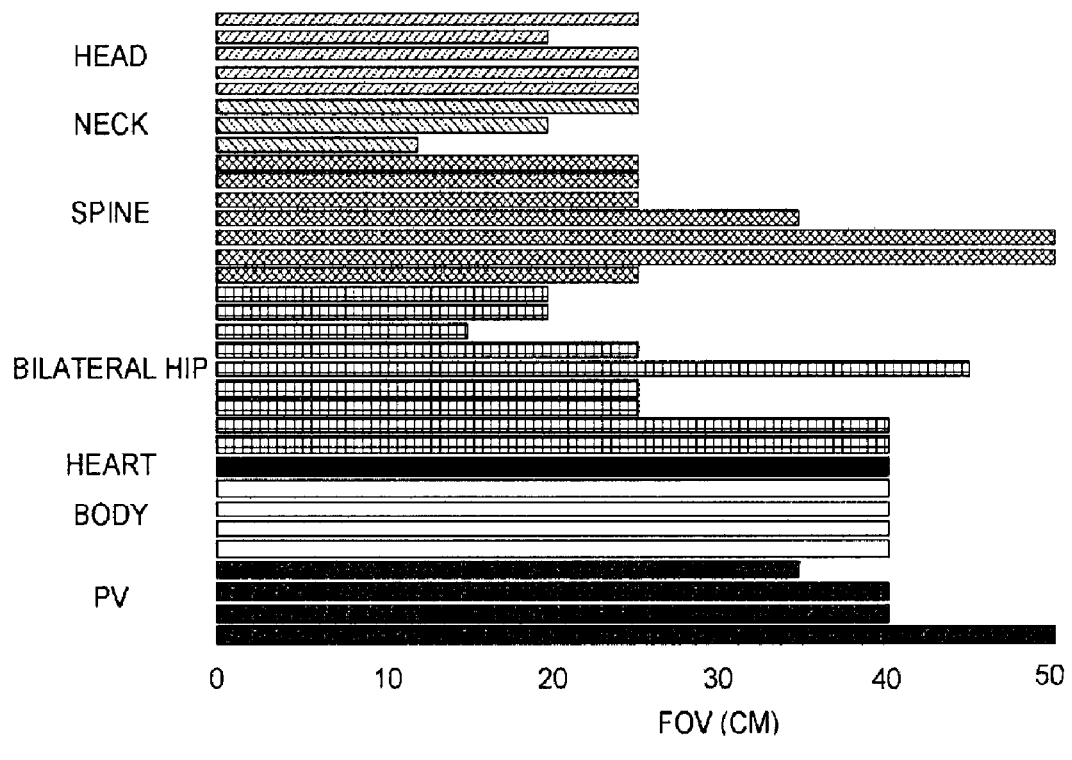
FIG. 9 illustrates the relationship between image types and field-of-view (FOV) in accordance to an embodiment.

FIG. 8 is a circuit diagram 800 according to an embodiment having a short magnet with field-of-view extension circuit. The circuit 800 can be implemented in a magnetic resonance imaging (MRI) system such as apparatus 700. Apparatus 800 solves the need in the art for a magnetic resonance imaging system that is more comfortable for patients, is less likely to invoke a sense of claustrophobia in patients, does not reduce the length of the uniform field region, and does not compromise the imaging functionality without adding mechanical complexity.

The MRI system 800 includes a series of superconducting coils (702, 704, 706, 708, 710) (arranged to the left side 526 of an MRI system, a right side 528 and an active shield 530. Labels on the coils are an "L" to indicate a large sized coil, "R" to indicate a reverse coil, "M" to indicate a medium sized coil, a "C" to indicate a center coil, a "B" to indicate a bucking coil and a "SB" to indicate a shim bucking coil.

The system 800 also includes superconducting switches (802, 804 and 806) and protection diodes (808, 810 and 812) wired in parallel. The supplementary circuitry on system 800 that helps implement an elongated field-of-view is split into two to avoid complications of current sharing.

CONCLUSION

A geometrically asymmetrical magnet coil or symmetrical magnet coil with additional asymmetric coils or circuitry is described. Although specific embodiments are illustrated and described herein, it will be appreciated by those of ordinary skill in the art that any arrangement which is calculated to achieve the same purpose may be substituted for the specific embodiments shown. This application is intended to cover any adaptations or variations.

In particular, one of skill in the art will readily appreciate that the names of the methods and apparatus are not intended to limit embodiments. Furthermore, additional methods and apparatus can be added to the components, functions can be rearranged among the components, and new components to correspond to future enhancements and physical devices used in embodiments can be introduced without departing from the scope of embodiments. One of skill in the art will readily recognize that embodiments are applicable to future magnet coils, different shield coils, and new cryogenic containers. In addition, other techniques such as a conical bore and asymmetric fringe field can be implemented along with the above aspect.

The terminology used in this application with respect to coils, shims and circuits is meant to include all environments and alternate technologies which provide the same functionality as described herein

I claim:

1. A magnetic resonance imaging apparatus comprising:
   a cryogenic container;
   a field-of-view elongation coil mounted in the cryogenic container and having a plurality of positive (+ve) turns and a plurality of negative (−ve) turns;
   a geometrically asymmetrical magnet coil being mounted in the cryogenic container, having a plurality of positive (+ve) turns and a plurality of negative (−ve) turns, wherein the geometrically asymmetrical magnet coil is operable to generate a magnetic field having a homogenous elongated field-of-view when current is present in the elongation coil and the geometrically asymmetrical magnet coil, wherein a ±5 ppm contour line of the generated homogenous elongated field-of-view is non-spherical; and
   a shield coil mounted in the cryogenic container.

2. The apparatus of claim 1, wherein the geometrically asymmetrical magnet coil further comprises:
   a geometrically asymmetrical magnet coil that is operable to change a shape of the generated homogenous elongated field-of-view from injected current and subtracted current, wherein the generated homogenous elongated field-of-view becomes non-spherical and elongated based on either the injected or subtracted current within the asymmetrical magnet coil.

3. The apparatus of claim 2 further comprising:
a high odd-order shim within the cryogenic container that is operable to further elongate the homogenous elongated field-of-view in one direction.

4. The apparatus of claim 1, wherein the magnet coil further comprises:
a plurality of high odd-order shim coils mounted in the cryogenic container.

5. The apparatus of claim 4, wherein a positive current (+ve) in the high odd-order shim coils causes the homogenous non-spherical elongated field-of-view to further elongate in a direction from a center of the homogenous non-spherical elongated field-of-view and a negative current (−ve) in the high odd-order shim coils causes the field-of-view to further elongate in an opposite direction from the center of the homogenous non-spherical elongated field-of-view.

6. The apparatus of claim 1, wherein the geometrically asymmetrical magnet coil further comprises:
a high odd-order shim mounted in the cryogenic container that is operable to activate specific parts of the geometrically asymmetrical magnet coil by injecting additional current and/or subtracting current from specific turns of the geometrically asymmetrical magnet coil.

7. The apparatus of claim 6, wherein a positive current (+ve) in the high odd-order shim causes the elongated field-of-view to further elongate in a direction from a center of the homogenous non-spherical elongated field-of-view and a negative current (−ve) in the high odd-order shim causes the from a center of the homogenous non-spherical elongated field-of-view to extend in an opposite direction from the center of the homogenous non-spherical elongated field-of-view.

8. The apparatus of claim 1, wherein the ±5 ppm contour line extends more than 20 centimeters past a center line at a longitudinal axis on one end of the magnetic resonance imaging apparatus and the ±5 ppm line extends less than 20 centimeters past the center line at the longitudinal axis on the other end of the magnetic resonance imaging apparatus.

9. The apparatus of claim 3, wherein the apparatus further comprises:
an active high odd-order shim shield mounted in the cryogenic container.

10. The apparatus of claim 4, wherein a positive current (+ve) in the high odd-order shim coils causes the elongated field-of-view to further elongate in a direction from a center of the homogenous non-spherical elongated field-of-view and a negative current (−ve) in the high odd-order shim coils causes the elongated field-of-view to further elongate in an opposite direction from the center of the homogenous non-spherical elongated field-of-view and
wherein the apparatus further comprises:
a series of superconducting coils within the cryogenic container arranged to a left side of the magnetic resonance imaging apparatus, a right side of the magnetic resonance imaging apparatus and arranged as part of an active shield of the magnetic resonance imaging apparatus;
a superconducting switch; and
a protection resistor wired in parallel with the superconducting switch, and
wherein the cryogenic container further comprises:
a turret;
a series of superconducting coils arranged in the left side of the cryogenic container, the right side of the cryogenic container and the active shield of the cryogenic container, and
wherein the apparatus further comprises:
a high temperature superconducting subsystem that brings wires of the superconducting coils outside of the cryogenic container; and
a power supply unit operably coupled to the superconducting coils through the wires.

11. A magnetic resonance imaging system having an isolated high odd-order shim in order to generate a non-spherical elongated field-of-view, the magnetic resonance imaging system comprising:
a cryogenic container;
a first primary magnet coil mounted in the cryogenic container and having a plurality of positive (+ve) turns and a plurality of negative (−ve) turns; and
an elongation coil mounted in the cryogenic container and having a plurality of positive (+ve) turns and a plurality of negative (−ve) turns,
wherein a current flowing in both the first primary magnet coil and the elongation coil causes an intrinsic field-of-view to extend in a direction outward from a center of the intrinsic field-of-view, and
wherein the overall length of the intrinsic field-of-view is elongated and increased at least 20% in comparison to the width of the intrinsic field-of-view when current is present in the elongation coil and the first primary magnet coil.

12. The magnetic resonance imaging system of claim 11 further comprising:
a high order shim mounted in the cryogenic container that is operable to activate specific parts of the first primary magnet coil by injecting additional current and/or subtracting current from specific turns of the first primary magnet coil.

13. The magnetic resonance imaging system of claim 11, wherein the magnetic resonance imaging system further comprises:
an active elongation coil shield mounted in the cryogenic container.

14. The magnetic resonance imaging system of claim 11, wherein a positive current (+ve) in the coils causes the field-of-view to further elongate in the direction from the center of the homogenous non-spherical elongated field-of-view and a negative current (−ve) in the coils causes the field-of-view to further elongate in an opposite direction from the center of the homogenous non-spherical elongated field-of-view.

15. The magnetic resonance imaging system of claim 11, wherein the magnetic resonance imaging system further comprises:
a series of superconducting coils within a cryogenic container and arranged to a left side of the magnetic resonance imaging system, a right side of the magnetic resonance imaging system and arranged as part of an active shield;
at least one superconducting switch operably coupled to the series of superconducting coils; and
at least one protection resistor wired in parallel with the at least one superconducting switch.

16. The magnetic resonance imaging system of claim 11, wherein the magnetic resonance imaging system further comprises:
a cryogenic container of the magnetic resonance imaging system further comprising a turret and a series of superconducting coils inside the cryogenic container and arranged in a left side of the magnetic resonance imaging system, a right side of the magnetic resonance imaging system and arranged as part of an active shield of the magnetic resonance imaging system;

a high temperature superconducting subsystem that brings wires of the superconducting coils outside of the cryogenic container; and a power supply unit operably coupled to the superconducting coils through the wires.

17. A magnetic resonance imaging system comprising:

a short main magnet with a supplementary field-of-view extension circuit operable to generate an elongated field-of-view within the magnetic resonance imaging system;

a cryogenic container;

a primary magnet coil mounted in the cryogenic container and having a plurality of positive (+ve) turns and having a plurality of negative (−ve) turns; and an elongation coil mounted in the cryogenic container, the elongation coil also having a plurality of positive (+ve) turns and having a plurality of negative (−ve) turns, wherein a current in the primary magnet coil and the elongation coil causes the field-of-view of the magnetic resonance imaging system to elongate in a direction that provides the elongated field-of-view with geometric dimensions similar to a pear within the magnetic resonance imaging system.

18. The magnetic resonance imaging system of claim 17, wherein the magnetic resonance imaging system further comprises:

an active elongation coil shield mounted in the cryogenic container, and wherein a positive current (+ve) in the primary magnet coil and the elongation coil causes the field-of-view of the magnetic resonance imaging system to further elongate in a direction from a center of the elongated field-of-view and a negative current (−ve) in the primary magnet coil and the elongation coil causes the field-of-view of the magnetic resonance imaging system to further elongate in an opposite direction from the center of the elongated field-of-view.

19. The magnetic resonance imaging system of claim 17, wherein the magnetic resonance imaging system further comprises:

a series of superconducting coils arranged to a left side of the magnetic resonance imaging system, a right side of the magnetic resonance imaging system and arranged as part of an active shield;

at least one superconducting switch; and at least one protection resistor wired in parallel with the at least one superconducting switch.

20. The magnetic resonance imaging system of claim 17, wherein the magnetic resonance imaging system further comprises:

a cryogenic container of the magnetic resonance imaging system further comprising a turret and a series of superconducting coils arranged within the cryogenic container in a left side of the magnetic resonance imaging system, a right side of the magnetic resonance imaging system and arranged as part of an active shield of the magnetic resonance imaging system; and a high temperature superconducting subsystem that has wires of the superconducting coils outside of the cryogenic container; and a power supply unit operably coupled to the superconducting coils.

* * * * *